United States Patent
Xu

(10) Patent No.: US 10,950,818 B2
(45) Date of Patent: Mar. 16, 2021

(54) APPARATUS AND METHOD FOR MANUFACTURING DISPLAY ASSEMBLY

(71) Applicant: WUHAN CHINA STAR OPTOELECTRONICS SEMICONDUCTOR DISPLAY TECHNOLOGY CO., LTD., Hubei (CN)

(72) Inventor: Jie Xu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 156 days.

(21) Appl. No.: 16/078,068

(22) PCT Filed: Aug. 10, 2018

(86) PCT No.: PCT/CN2018/099779
§ 371 (c)(1),
(2) Date: Aug. 21, 2018

(87) PCT Pub. No.: WO2019/223126
PCT Pub. Date: Nov. 28, 2019

(65) Prior Publication Data
US 2019/0355926 A1 Nov. 21, 2019

(30) Foreign Application Priority Data

May 21, 2018 (CN) .......................... 201810485874.9

(51) Int. Cl.
*H01L 51/52* (2006.01)
*H01L 51/56* (2006.01)
(Continued)

(52) U.S. Cl.
CPC ........ *H01L 51/5246* (2013.01); *G02F 1/1303* (2013.01); *G02F 1/133308* (2013.01); *H01L 51/56* (2013.01); *G02F 1/133325* (2021.01)

(58) Field of Classification Search
CPC ... H01L 51/5246; H01L 51/56; G02F 1/1303; G02F 1/133308
See application file for complete search history.

(56) References Cited

U.S. PATENT DOCUMENTS 6,143,231 A * 11/2000 DiSimone ........... B29C 45/2608
264/1.33
2009/0136738 A1* 5/2009 Kondo ................. C09D 133/06
428/323
(Continued)

FOREIGN PATENT DOCUMENTS

CN      103885241 A      6/2014
CN      105437441 A  *   3/2016
(Continued)

OTHER PUBLICATIONS

Machine Translation of CN-106373917-A (Year: 2017).*
Machine Translation of CN-105437441-A (Year: 2016).*

*Primary Examiner* — Daniel McNally
(74) *Attorney, Agent, or Firm* — Mark M. Friedman

(57) ABSTRACT

The present disclosure provides a display assembly manufacturing apparatus and a method for manufacturing a display assembly. The display assembly manufacturing apparatus includes a holding platform configured to hold a display device; a covering plate configured to cover the display device, such that a supporting film molding space is formed between an inner surface of the covering plate and a surface of the display device, wherein the supporting film molding space is configured to receive a liquid material which is cured in the supporting film molding space, such that the liquid material is molded into the supporting film.

(Continued)

According to the present disclosure, a supporting film having a smaller thickness is integrated with the display device.

16 Claims, 5 Drawing Sheets

(51) Int. Cl.
    *G02F 1/1333*     (2006.01)
    *G02F 1/13*     (2006.01)

(56) References Cited

U.S. PATENT DOCUMENTS

2013/0321746 A1    12/2013    Kim
2014/0347597 A1    11/2014    Kim et al.

FOREIGN PATENT DOCUMENTS

| CN | 105437441 A | | 3/2016 |
|---|---|---|---|
| CN | 105709994 A | | 6/2016 |
| CN | 105917451 A | | 8/2016 |
| CN | 106373917 A | * | 2/2017 |
| CN | 106373917 A | | 2/2017 |
| CN | 107978623 A | | 5/2018 |

* cited by examiner

APPARATUS AND METHOD FOR MANUFACTURING DISPLAY ASSEMBLY

FIELD OF INVENTION

The present disclosure relates to the field of display assembly technology, and more particularly to a display assembly manufacturing apparatus, a method for manufacturing a display assembly, and a display assembly.

BACKGROUND

Generally, a traditional display assembly includes a display device and a supporting film. The supporting film is stacked on and integrated with the display device.

In conventional methods, the supporting film is stacked on the display device and the supporting film is integrated with the display device. The conventional methods includes steps of disposing the supporting film on conveyor, transporting the supporting film to a location above the display device, aligning the supporting film with the display device, detaching the supporting film from the conveyor, and attaching the supporting film to the display device.

However, there are some problems existing in the prior art, as described below.

In the conventional methods, it is difficult to attach a supporting film, having a small thickness, to a display device, therefore it is required to have the supporting film have a larger thickness to be integrated with the display device. That is, according to the conventional methods, a supporting film, having a smaller thickness, cannot be integrated with a display device.

Therefore, there is a need to provide a new technical scheme to solve problems encountered in the prior art.

SUMMARY OF DISCLOSURE

The objective of the present disclosure is to provide a display assembly manufacturing apparatus and a method for manufacturing a display assembly, where a supporting film having a smaller thickness is integrated with the display device.

To solve the aforementioned problems, the present disclosure provides the following technical schemes:

A display assembly manufacturing apparatus includes:
a holding platform configured to hold a display device where a supporting film is to be formed; and
a covering plate configured to cover the display device, such that a supporting film molding space is formed between an inner surface of the covering plate and a surface of the display device far away from the holding platform, wherein the supporting film molding space is configured to receive a liquid material which is cured in the supporting film molding space, such that the liquid material is molded into the supporting film stacked on and integrated with the display device;
wherein the covering plate is movable along a direction perpendicular to a surface of the holding platform, such that a distance between the inner surface of the covering plate and the surface of the display device far away from the holding platform is adjustable;
wherein the display assembly manufacturing apparatus further includes:
a vacuum lifting member disposed on the holding platform, wherein the vacuum lifting member is configured to lift and move the display device, so that the display device is held by the holding platform; and
wherein the covering plate includes a liquid material injecting port, the liquid material injecting port passes through the covering plate and communicates with the supporting film molding space, and the liquid material injecting port is configured to inject the liquid material into the supporting film molding space.

In one embodiment of the display assembly manufacturing apparatus, the covering plate is further configured to be separated from the holding platform after the liquid material is molded into the supporting film, so as to open the receiving chamber.

A display assembly manufacturing apparatus includes:
a holding platform configured to hold a display device where a supporting film is to be formed; and
a covering plate configured to cover the display device, such that a supporting film molding space is formed between an inner surface of the covering plate and a surface of the display device far away from the holding platform, wherein the supporting film molding space is configured to receive a liquid material which is cured in the supporting film molding space, such that the liquid material is molded into the supporting film stacked on and integrated with the display device.

In one embodiment of the display assembly manufacturing apparatus, the covering plate is movable along a direction perpendicular to a surface of the holding platform, such that a distance between the inner surface of the covering plate and the surface of the display device far away from the holding platform is adjustable.

In one embodiment of the display assembly manufacturing apparatus, the display assembly manufacturing apparatus further includes:
a vacuum lifting member disposed on the holding platform, wherein the vacuum lifting member is configured to lift and move the display device, so that the display device is held by the holding platform.

In one embodiment of the display assembly manufacturing apparatus, the vacuum lifting member is further configured to release the display assembly including the display device and the supporting film after the liquid material is molded into the supporting film.

In one embodiment of the display assembly manufacturing apparatus, the covering plate is further configured to be separated from the holding platform after the liquid material is molded into the supporting film, so as to open the receiving chamber.

In one embodiment of the display assembly manufacturing apparatus, the covering plate includes a liquid material injecting port, the liquid material injecting port passes through the covering plate and communicates with the supporting film molding space, and the liquid material injecting port is configured to inject the liquid material into the supporting film molding space.

In one embodiment of the display assembly manufacturing apparatus, the covering plate includes a first end and a second end disposed at two ends of the covering plate; a flexible element is disposed between the first and second ends and the holding platform; and the flexible element is configured to seal a receiving space enclosed by the holding platform and the covering plate.

In one embodiment of the display assembly manufacturing apparatus, a distance between the inner surface of the covering plate and the surface of the display device far away from the holding platform ranges from 1 µm to 50 µm.

A method for manufacturing a display assembly includes:
a step A of holding a display device, where a supporting film is to be formed, on a holding platform;

a step B of using a covering plate to cover the display device, such that a supporting film molding space is formed between an inner surface of the covering plate and a surface of the display device far away from the holding platform;

a step C of injecting a liquid material into the supporting film molding space; and a step D of receiving the liquid material in the supporting film molding space and curing the liquid material, such that the liquid material is molded into the supporting film stacked on and integrated with the display device.

In one embodiment of the method for manufacturing the display assembly, after the step B, the method for manufacturing the display assembly further includes:

a step E of moving the covering plate along a direction perpendicular to a surface of the holding platform, so as to adjust a distance between the inner surface of the covering plate and the surface of the display device far away from the holding platform.

In one embodiment of the method for manufacturing the display assembly, the step A includes:

a step a1 of disposing the display device, where the supporting film is to be formed, on a vacuum lifting member of the holding platform; and a step a2 of using the vacuum lifting member to lift and move the display device, so that the display device is held by the holding platform.

In one embodiment of the method for manufacturing the display assembly, after the step D, the method for manufacturing the display assembly further includes:

a step G of using the vacuum lifting member to release the display assembly including the display device and the supporting film after the liquid material is molded into the supporting film.

In one embodiment of the method for manufacturing the display assembly, after the step D, the method for manufacturing the display assembly further includes:

a step F of separating the covering plate from the holding platform after the liquid material is molded into the supporting film, so as to open the receiving chamber.

In one embodiment of the method for manufacturing the display assembly, the step C includes:

injecting the liquid material into the supporting film molding space through a liquid material injecting port of the covering plate.

In one embodiment of the method for manufacturing the display assembly, when the covering plate covers the display device, a first end and a second end disposed at two ends of the covering plate press a flexible element disposed between the first and second ends and the holding platform; and the flexible element is configured to seal a receiving space enclosed by the holding platform and the covering plate.

In one embodiment of the method for manufacturing the display assembly, a distance between the inner surface of the covering plate and the surface of the display device far away from the holding platform ranges from 1 μm to 50 μm.

A display assembly includes:

a display device; and a supporting film;

wherein the supporting film is stacked on and integrated with the display device, and the supporting film is made of a material selected from acrylic resin or epoxy resin.

In one embodiment of the display assembly, the supporting film includes a metallic ion and an inorganic compound, and the metallic ion and the inorganic compound are configured to increase a water blocking and moisture resisting property and an electrostatic shielding property of the supporting film.

According to the present disclosure, a supporting film molding space is formed between the covering plate and the display device first, then a liquid material is injected into the supporting film molding space, and the liquid material is cured, therefore a supporting film having a smaller thickness can be formed on the display device. In other words, according to the present disclosure, a supporting film having a smaller thickness is integrated with the display device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
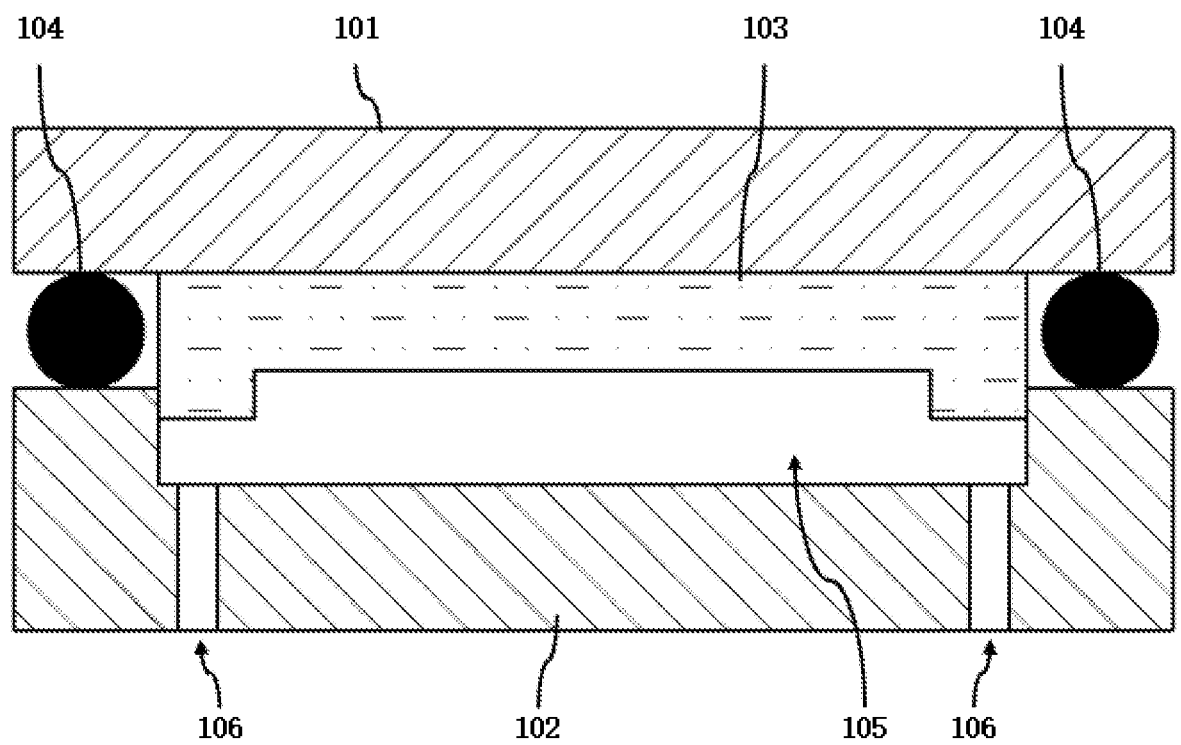
FIG. 1 is a schematic diagram showing a structure of a display assembly manufacturing apparatus according to one embodiment of the present disclosure.
Figure 2:
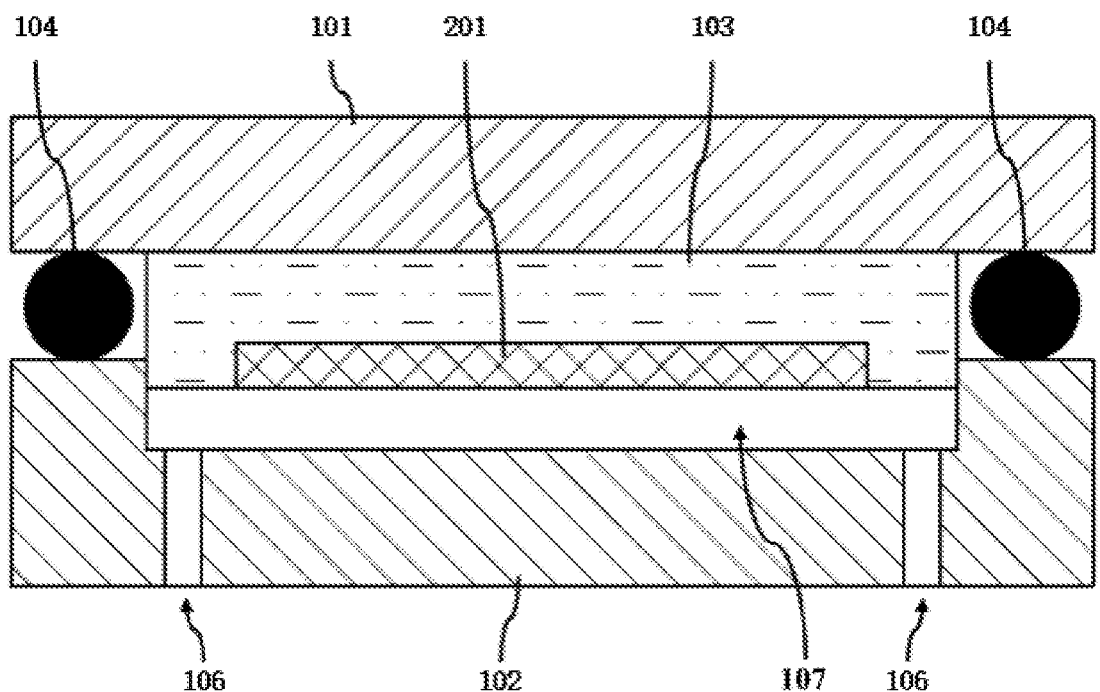
FIGS. 2, 3, 4, and 5 are schematic diagrams showing a process of a method for manufacturing a display assembly manufacturing apparatus according to one embodiment of the present disclosure.
Figure 3:
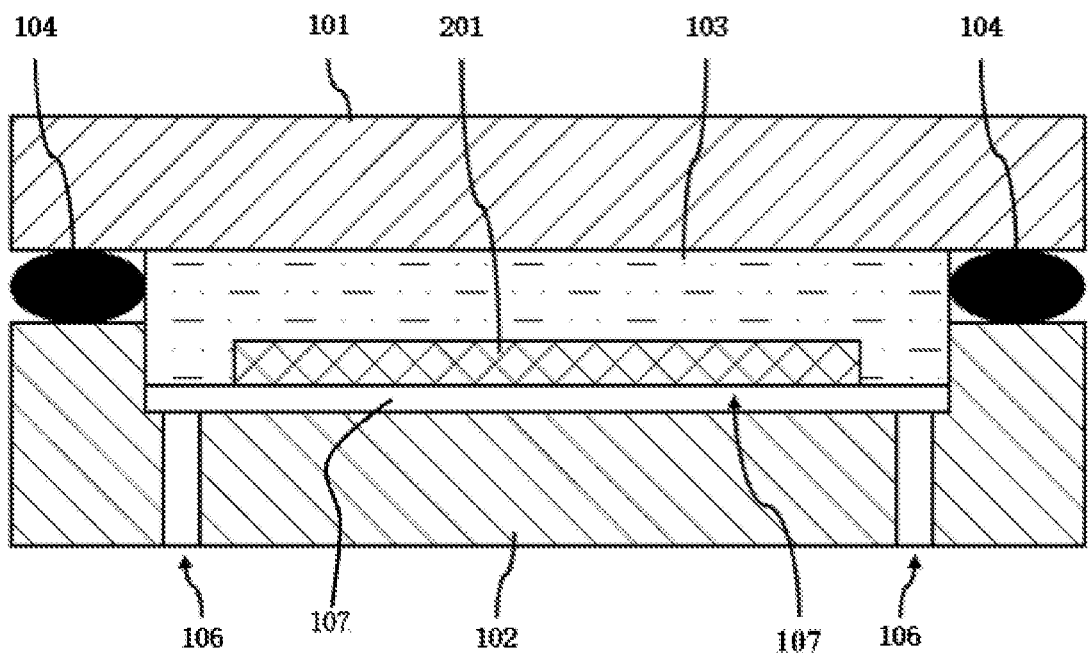
Figure 4:
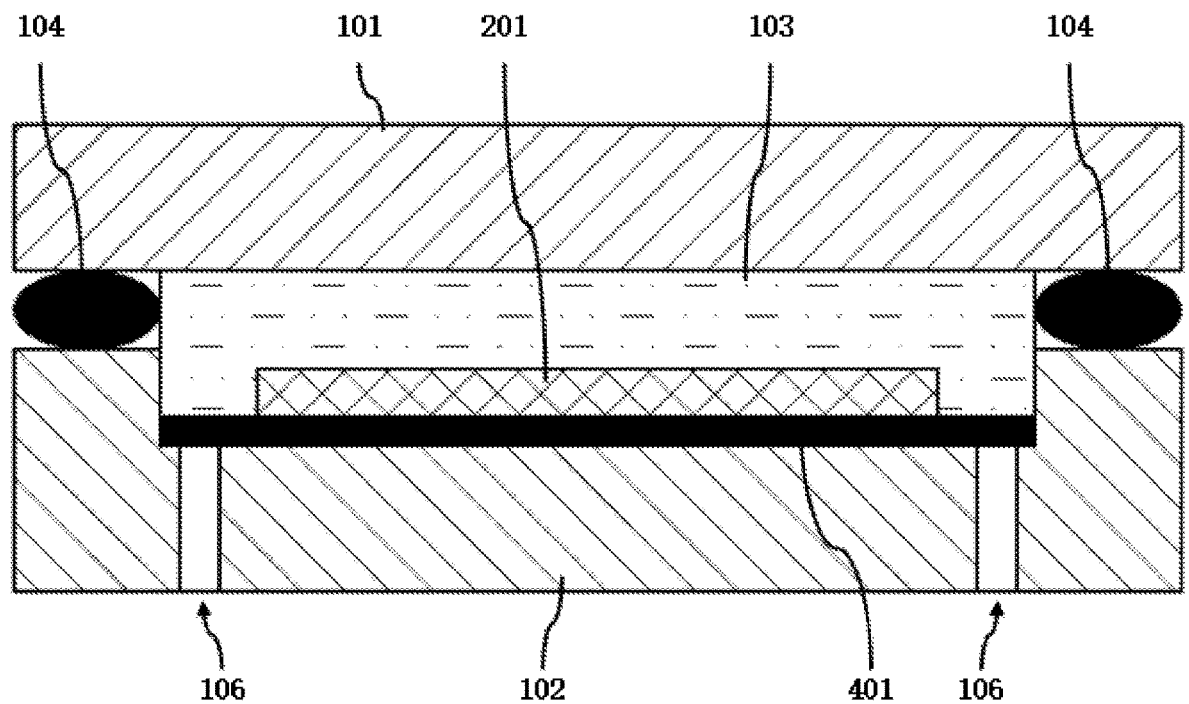
Figure 5:
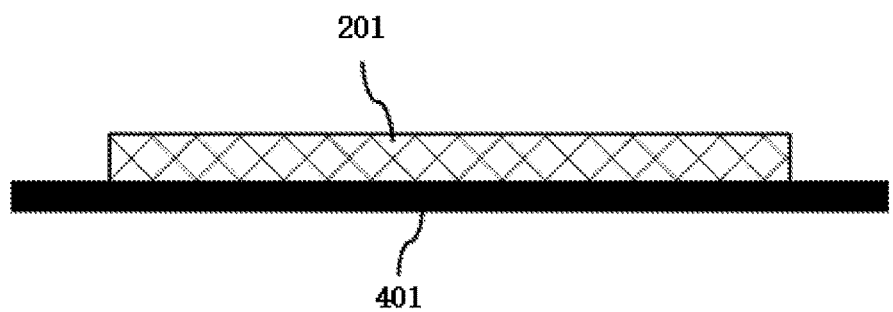

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Please refer to FIGS. 1-5. FIG. 1 is a schematic diagram showing a structure of a display assembly manufacturing apparatus according to one embodiment of the present disclosure. FIGS. 2-5 are schematic diagrams showing a process of a method for manufacturing a display assembly manufacturing apparatus according to one embodiment of the present disclosure.

The display assembly manufacturing apparatus of the present disclosure includes a holding platform 101 and a covering plate 102.

The holding platform 101 is configured to hold a display device 201 where a supporting film 401 is to be formed. The display device 201 or display assembly of the present disclosure could be used produce thin film transistor liquid crystal display (TFT-LCD) or organic light emitting diode (OLED) display.

The covering plate 102 is configured to cover the display device 201, such that a supporting film molding space 107 is formed between an inner surface of the covering plate 102 and a surface of the display device 201 far away from the holding platform 101, wherein the supporting film molding space 107 is configured to receive a liquid material which is cured in the supporting film molding space, such that the liquid material is molded into the supporting film 401 stacked on and integrated with the display device 201.

The liquid material (or the supporting film) is made of a material selected from acrylic resin (acrylic based organic polymer) or epoxy resin (epoxy based organic polymer). The liquid material (or the supporting film) further includes a metallic ion and an inorganic compound. The metallic ion and the inorganic compound are configured to increase a water blocking and moisture resisting property and an electrostatic shielding property of the supporting film.

The covering plate 102 is combined with the holding platform 101. The combined structure of the covering plate 102 and the holding platform 101 defines a receiving chamber 105 into which the display device 210 is disposed.

The covering plate 102 includes a first end and a second end disposed at two ends of the covering plate 102. A flexible element 104 is disposed between the first and second ends and the holding platform 101.

The flexible element 104 is configured to seal a receiving space enclosed by the holding platform 101 and the covering plate 102.

The flexible element 104 servers as a buffer to receive impact from the covering plate 102 when the covering plate 102 moves towards the holding platform 101.

The flexible element 104 is ring-shaped. The flexible element 104 surrounds a vacuum lifting member 103 and/or the display device 201. The flexible element 104 consists of a plurality of elongated parts that are connected to each other at front and rear ends thereof. The elongated parts are made of a material such as rubber or plastics. The elongated parts could be hollow tubes or solid bars.

The flexible element 104 consisted of elongated parts has a cross-section of regular shapes such as a circle, an oval, a rectangle, or a hexagon, or other irregular shapes.

To increase sealing, the flexible element 104 further includes wrinkles or spurs on surface thereon. The wrinkles or spurs are used to make the flexible element 104 tightly contact the holding platform 101 and/or the covering plate 102 when the flexible element 104 is pressed by the holding platform 101 and/or the covering plate 102.

The covering plate 102 includes a liquid material injecting port 106. The liquid material injecting port 106 passes through the covering plate 102 and communicates with the supporting film molding space 107. The liquid material injecting port 106 is configured to inject the liquid material into the supporting film molding space 107.

The covering plate 102 is movable along a direction perpendicular to a surface of the holding platform 101, such that a distance between the inner surface of the covering plate 102 and the surface of the display device 201 far away from the holding platform 101 is adjustable.

The display assembly manufacturing apparatus further includes an adjustment member. The adjustment member is configured to control movement of the covering plate 102 along the direction perpendicular to surface of the holding platform 101, so as to adjust the distance between the inner surface of the covering plate 102 and the surface of the display device 201 far away from the holding platform 101. The adjustment member is connected to the holding platform 101 and the covering plate 102. The adjustment member includes a threaded post and a knob. The two ends of the threaded post are connected to the holding platform 101 and the covering plate 102, respectively. The knob is disposed at one end of the threaded post, and is embedded inside the knob. The knob is moveable along a longitudinal direction of the threaded post by being rotated around the threaded post, such that the distance between the inner surface of the covering plate 102 and the surface of the display device 201 far away from the holding platform 101 is adjustable.

A distance between the inner surface of the covering plate 102 and the surface of the display device 201 far away from the holding platform 101 ranges from 1 μm to 50 μm. For example, the distance could be 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, or 50 μm.

Preferably, the distance ranges from 3 μm to 50 μm. In one embodiment, the distance is 10 μm.

The display assembly manufacturing apparatus further includes a vacuum lifting member 103 disposed on the holding platform 101. The vacuum lifting member 103 is configured to lift and move the display device 201, so that the display device 201 is held by the holding platform 101.

Specifically, the vacuum lifting member 103 are suction cups. Moreover, to avoid the sucked display device 201 from swinging, the vacuum lifting member 103 includes an array of suction cups. The array of suction cups includes at least two suction cups. At least two suction cups are disposed on the holding platform in a form of a one-dimension array or a two-dimension array.

The holding platform 101 further includes an evacuation hole. The evacuation hole is connected to the vacuum lifting member 103. The evacuation hole is configured to evacuate air between a suction surface of the vacuum lifting member 103 and a surface of the display device 201 opposite to the holding platform 101, such that a vacuum state is formed between the suction surface and the surface of the display device 201 opposite to the holding platform 101.

The covering plate 102 is further configured to be separated from the holding platform 101 after the liquid material is molded into the supporting film 401, so as to open the receiving chamber 105.

Specifically, the adjustment member is further configured to release the covering plate 102 to have the covering plate 102 separate from the holding platform 101, so as to open the receiving chamber 105.

The vacuum lifting member 103 is further configured to release the display assembly including the display device 201 and the supporting film 401 after the liquid material is molded into the supporting film 401.

Specifically, the evacuation hole is further configured to transport air towards the vacuum lifting member 103 to break the vacuum state between the suction surface of the vacuum lifting member 103 and the surface of the display device 201 opposite to the holding platform 101, so as to release the display assembly.

Figure 6:
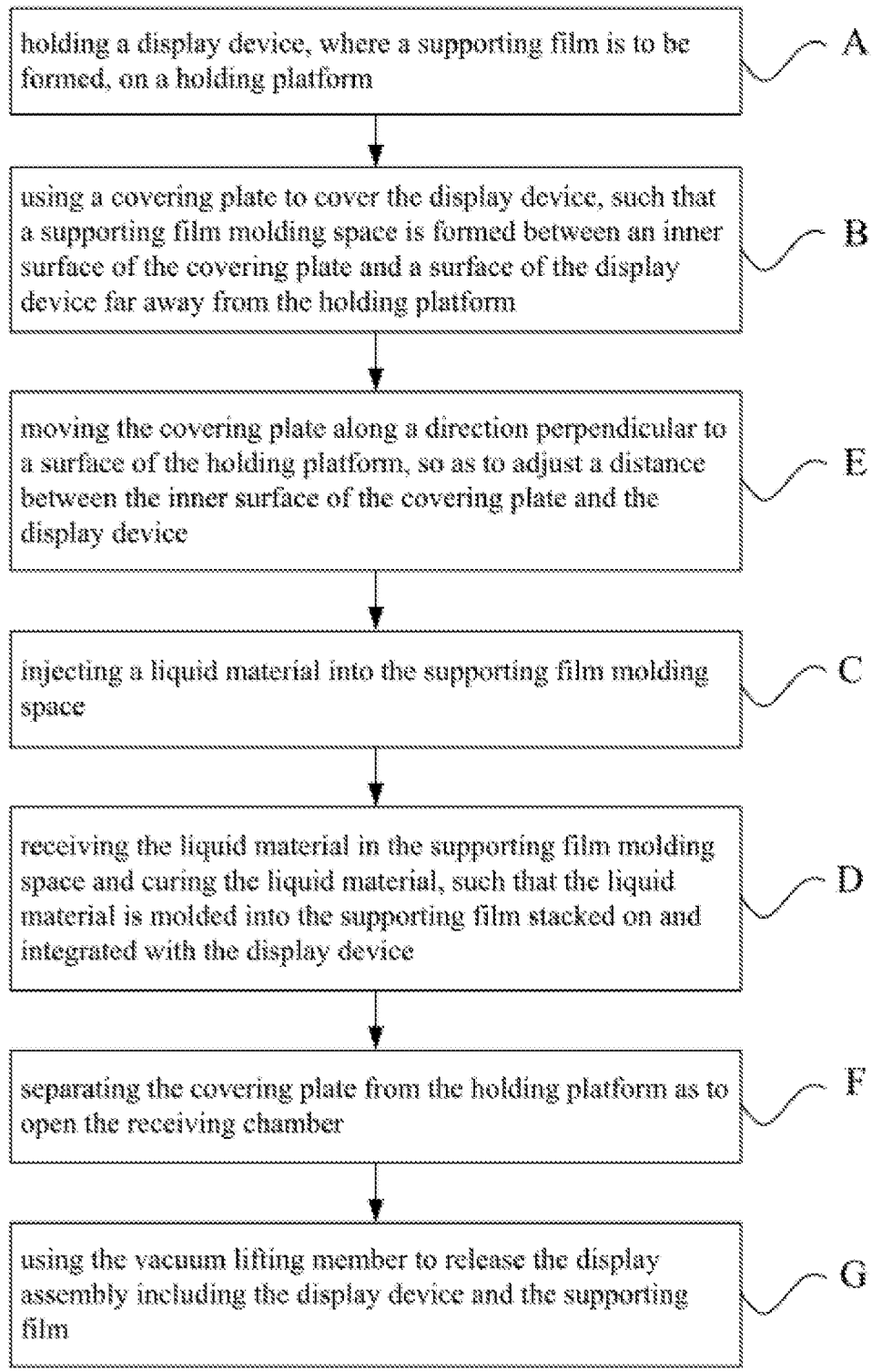
FIG. 6 is a flow chart of a method for manufacturing a display assembly manufacturing apparatus according to one embodiment of the present disclosure.
Figure 7:
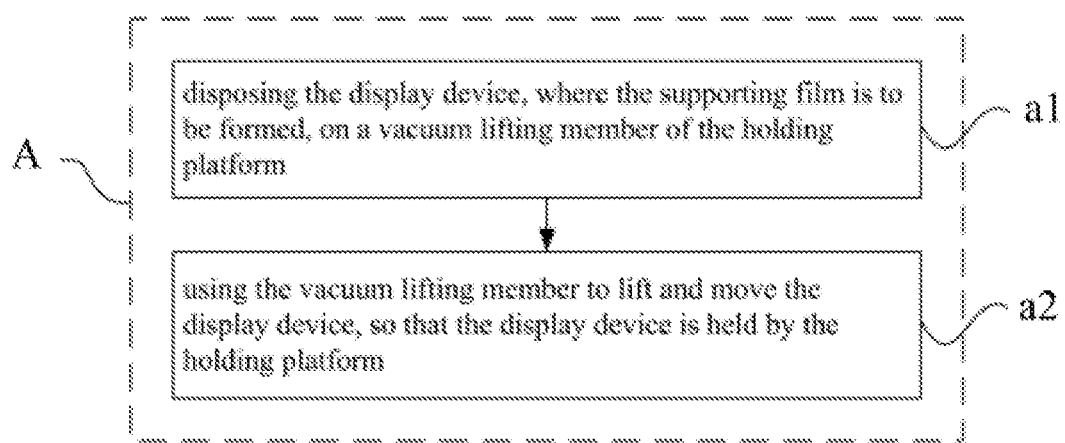
FIG. 7 shows steps of holding a display device, where a supporting film is to be formed, on the holding platform in the method for manufacturing a display assembly manufacturing apparatus of FIG. 6.

Please refer to FIGS. 2-7. FIGS. 2-5 are schematic diagrams showing a process of a method for manufacturing a display assembly manufacturing apparatus according to one embodiment of the present disclosure. FIG. 6 is a flow chart of a method for manufacturing a display assembly manufacturing apparatus according to one embodiment of the present disclosure. FIG. 7 shows steps of holding a display device 201, where a supporting film 401 is to be formed, on the holding platform 101 in the method for manufacturing a display assembly manufacturing apparatus of FIG. 6.

The method for manufacturing a display assembly according to the present disclosure includes the following steps.

In a step A, a display device 201, where a supporting film 401 is to be formed, is held on a holding platform 101.

In a step B, a covering plate 102 is used to cover the display device 201, such that a supporting film molding space 107 is formed between an inner surface of the covering plate 102 and a surface of the display device 201 far away from the holding platform 101.

After the covering plate 102 is combined with the holding platform 101, the combined structure of the covering plate 102 and the holding platform 101 defines a receiving chamber 105 into which the display device 210 is disposed.

When the covering plate 102 covers the display device 201, a first end and a second end disposed at two ends of the covering plate 102 press a flexible element 104 disposed between the first and second ends and the holding platform 101.

The flexible element 104 is configured to seal a receiving space enclosed by the holding platform 101 and the covering plate 102.

The flexible element 104 servers as a buffer to receive impact from the covering plate 102 when the covering plate 102 moves towards the holding platform 101.

In a step C, a liquid material is injected into the supporting film molding space 107.

Specifically, the step C includes:
injecting the liquid material into the supporting film molding space 107 through a liquid material injecting port 106 of the covering plate 102.

In a step D, the liquid material is received in the supporting film molding space 107 and the liquid material is cured, such that the liquid material is molded into the supporting film 401 stacked on and integrated with the display device 201.

After the step B, the method for manufacturing the display assembly further includes:
a step E of moving the covering plate 102 along a direction perpendicular to a surface of the holding platform 101, so as to adjust a distance between the inner surface of the covering plate 102 and the surface of the display device 201 far away from the holding platform 101.

Specifically, the adjustment member of the display assembly manufacturing apparatus controls movement of the covering plate 102 along the direction perpendicular to surface of the holding platform 101, so as to adjust the distance between the inner surface of the covering plate 102 and the surface of the display device 201 far away from the holding platform 101.

The knob of the adjustment member is moveable along a longitudinal direction of the threaded post by being rotated around the threaded post, such that the distance between the inner surface of the covering plate 102 and the surface of the display device 201 far away from the holding platform 101 is adjustable.

A distance between the inner surface of the covering plate 102 and the surface of the display device 201 far away from the holding platform 101 ranges from 1 μm to 50 μm. For example, the distance could be 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, or 50 μm.

Preferably, the distance ranges from 3 μm to 50 μm. In one embodiment, the distance is 10 μm.

The step A includes:

a step a1 of disposing the display device 201, where the supporting film 401 is to be formed, on a vacuum lifting member 103 of the holding platform 101; and a step a2 of using the vacuum lifting member 103 to lift and move the display device 201, so that the display device 201 is held by the holding platform 101.

After the step a1 and before the step a2, the step A further includes:
a step a3 of using an evacuation hole of the holding platform 101 to evacuate air between a suction surface of the vacuum lifting member 103 and a surface of the display device 201 opposite to the holding platform 101, such that a vacuum state is formed between the suction surface and the surface of the display device 201 opposite to the holding platform 101.

After the step D, the method for manufacturing the display assembly further includes:
a step F of separating the covering plate 102 from the holding platform 101 after the liquid material is molded into the supporting film 401, so as to open the receiving chamber 105.

Specifically, the adjustment member releases the covering plate 102 to have the covering plate 102 separate from the holding platform 101, so as to open the receiving chamber 105.

After the step D, the method for manufacturing the display assembly further includes:
a step G of using the vacuum lifting member 103 to release the display assembly including the display device 201 and the supporting film 401 after the liquid material is molded into the supporting film 401.

Specifically, air is transported through the evacuation hole and towards the vacuum lifting member 103 to break the vacuum state between the suction surface of the vacuum lifting member 103 and the surface of the display device 201 opposite to the holding platform 101, so as to release the display assembly.

The display assembly of the present disclosure includes a display device 201 and a supporting film 401. The supporting film 401 is stacked on and integrated with the display device 201. The supporting film 401 is formed by using the covering plate 102 to cover the display device 201 held in the holding platform 101, such that a supporting film molding space 107 is formed between an inner surface of the covering plate 102 and a surface of the display device 201 far away from the holding platform 101; injecting a liquid material into the supporting film molding space 107; and curing the liquid material. The supporting film 401 is made of a material selected from acrylic resin or epoxy resin.

The liquid material includes a metallic ion and an inorganic compound. The metallic ion and the inorganic compound are configured to increase a water blocking and moisture resisting property and an electrostatic shielding property of the supporting film 401.

According to the present disclosure, a supporting film molding space 107 is formed between the covering plate 102 and the display device 201 first, then a liquid material is injected into the supporting film molding space 107, and the liquid material is cured, therefore a supporting film 401 having a smaller thickness can be formed on the display device 201. In other words, according to the present disclosure, a supporting film 401 having a smaller thickness is integrated with the display device 201. Since an attachment step is not required, the product would not be influenced by such an attachment step. The supporting film 401 of the display assembly formed according to the present disclosure has a much smaller thickness than that of the supporting film of the display assembly formed according to the prior art, thus making display assembly have light weight and thin thickness.

In addition, different from the conventional methods where the supporting film is produced in advance and is then attached to surface of the display device, the present disclosure does not require the supporting film 401 to be aligned with the display device 201. The present disclosure solves the problems encountered by the prior art, where the manufacturing duration is long because of difficulty of alignment of the supporting film to the display device. Therefore, the invention provided by the present disclosure simplifies manufacturing steps, shortens manufacturing duration, and increases manufacturing efficiency.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display assembly manufacturing apparatus, comprising:
    a holding platform;
    a vacuum lifting member disposed on the holding platform and configured to surround and suck a display device and only expose a surface of the display device far away from the holding platform; and
    a covering plate configured to cover the display device, the vacuum lifting member, and the holding platform, such that an inner surface of the covering plate, the exposed surface of the display device, and a surface of the vacuum lifting member close to the covering plate form a supporting film molding space, wherein the supporting film molding space is configured to receive a liquid material that is cured to form a supporting film, the covering plate is provided with one or more liquid material injecting ports, and the liquid material injecting ports vertically penetrate the covering plate, communicate with the supporting film molding space, and are configured to inject the liquid material into the supporting film molding space.

2. The display assembly manufacturing apparatus according to claim 1, further comprising a ring-shaped flexible element surrounding the vacuum lifting member, wherein the covering plate includes a first end and a second end disposed at two ends of the covering plate, and the flexible element is disposed between the first and second ends and the holding platform and is configured to seal the supporting film molding space.

3. The display assembly manufacturing apparatus according to claim 2, wherein the flexible element is further configured to receive impact from the covering plate when the covering plate moves towards the holding platform.

4. The display assembly manufacturing apparatus according to claim 1, wherein the covering plate is movable along a direction perpendicular to the holding platform, such that a distance between the inner surface of the covering plate and the exposed surface of the display device is adjustable.

5. The display assembly manufacturing apparatus according to claim 1, wherein the vacuum lifting member includes two or more suction cups disposed on the holding platform in a form of a one-dimension array or a two-dimension array.

6. The display assembly manufacturing apparatus according to claim 1, wherein the vacuum lifting member is further configured to release the display assembly including the display device and the supporting film after the liquid material is molded into the supporting film.

7. The display assembly manufacturing apparatus according to claim 1, wherein the covering plate is further configured to be separated from the holding platform after the liquid material is molded into the supporting film.

8. The display assembly manufacturing apparatus according to claim 1, wherein a number of the liquid material injecting ports is two, and the liquid material injecting ports are disposed on two opposite sides of the covering plate and correspond to the surface of the vacuum lifting member close to the covering plate.

9. A method for manufacturing a display assembly, comprising:
    a step A of placing a display device in a vacuum lifting member, wherein the vacuum lifting member is disposed on a holding platform and configured to surround and suck the display device and only exposes a surface of the display device far away from the holding platform;
    a step B of using a covering plate to cover the display device, the vacuum lifting member, and the holding platform, such that an inner surface of the covering plate, the exposed surface of the display device, and a surface of the vacuum lifting member close to the covering plate form a supporting film molding space, wherein the covering plate is provided with one or more liquid material injecting ports vertically penetrating the covering plate and communicating with the supporting film molding space;
    a step C of injecting a liquid material into the supporting film molding space through the liquid material injecting ports; and
    a step D of curing the liquid material in the supporting film molding space to form a supporting film, wherein the supporting film is stacked on the exposed surface of the display device, and the display device and the supporting film compose the display assembly.

10. The method for manufacturing the display assembly according to claim 9, wherein:
    when the covering plate covers the display device, a first end and a second end disposed at two ends of the covering plate press a flexible element disposed between the first and second ends and the holding platform; and
    the flexible element is ring-shaped, surrounds the vacuum lifting member, and is configured to seal the supporting film molding space.

11. The method for manufacturing the display assembly according to claim 10, wherein the flexible element is further configured to receive impact from the covering plate when the covering plate moves towards the holding platform.

12. The method for manufacturing the display assembly according to claim 9, after the step B, further comprising:
    a step E of moving the covering plate along a direction perpendicular tothe holding platform, so as to adjust a distance between the inner surface of the covering plate and the exposed surface of the display device.

13. The method for manufacturing the display assembly according to claim 9, wherein the vacuum lifting member includes two or more suction cups disposed on the holding platform in a form of a one-dimension array or a two-dimension array.

14. The method for manufacturing the display assembly according to claim 9, after the step D, further comprising:

a step G of using the vacuum lifting member to release the display assembly including the display device and the supporting film after the liquid material is molded into the supporting film.

15. The method for manufacturing the display assembly according to claim 9, after the step D, further comprising:
a step F of separating the covering plate from the holding platform after the liquid material is molded into the supporting film.

16. The method for manufacturing the display assembly according to claim 9, a number of the liquid material injecting ports is two, and the liquid material injecting ports are disposed on two opposite sides of the covering plate and correspond to the surface of the vacuum lifting member close to the covering plate.

* * * * *